United States Patent
Nguyen et al.

(10) Patent No.: US 10,917,991 B1
(45) Date of Patent: Feb. 9, 2021

(54) CIRCUIT BOARD MOUNTING IN CONFINED SPACE

(71) Applicant: HALLIBURTON ENERGY SERVICES, INC., Houston, TX (US)

(72) Inventors: Minh Dang Nguyen, Singapore (SG); Anand Prakash, Tomball, TX (US); Heen Wei Ng, Singapore (SG)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 0 days.

(21) Appl. No.: 16/601,253

(22) Filed: Oct. 14, 2019

(51) Int. Cl.
  *H05K 7/12* (2006.01)
  *H05K 5/00* (2006.01)
  *E21B 47/017* (2012.01)
  *E21B 49/00* (2006.01)

(52) U.S. Cl.
  CPC ............ *H05K 7/12* (2013.01); *E21B 47/017* (2020.05); *H05K 5/0004* (2013.01); *E21B 49/00* (2013.01)

(58) Field of Classification Search
  CPC ...... H05K 7/12; H05K 5/0004; E21B 47/017; E21B 49/00
  See application file for complete search history.

(56) References Cited

U.S. PATENT DOCUMENTS

| | | | | |
|---|---|---|---|---|
| 5,122,928 A | * | 6/1992 | Lo | G06F 1/1601 312/7.2 |
| 5,931,000 A | * | 8/1999 | Turner | E21B 36/003 62/3.2 |
| 6,012,537 A | * | 1/2000 | Rountree | E21B 47/20 175/40 |
| 6,327,160 B1 | | 12/2001 | Liao | |
| 6,424,540 B1 | * | 7/2002 | Chen | G06F 1/184 174/377 |

(Continued)

FOREIGN PATENT DOCUMENTS

GB 2209877 A 5/1989

OTHER PUBLICATIONS

Beckwith, Robin, "Downhole Electronic Components: Achieving Performance Reliability", JPT, Aug. 2013.

*Primary Examiner* — Abhishek M Rathod
(74) *Attorney, Agent, or Firm* — Polsinelli PC (57) ABSTRACT

Aspects of the subject technology relate to a circuit board mounting assembly for use in a downhole tool. The assembly can include a sleeve comprising a plurality of flaps and a circuit board disposed on the proximal end of the sleeve and secured by the plurality of flaps. The assembly can include a hollow housing comprising a shoulder on an interior surface of the housing at a proximal portion of the housing and a circuit board disposed on the shoulder of the housing. The assembly can further include a groove disposed on the interior surface and a ring disposed within the groove. The assembly can further include a threaded portion on the interior surface extending from a distal end of the housing and a nut threadedly engaged with the threaded portion of the housing. An example method for mounting a circuit board in a downhole tool can include disposing a circuit board on a shoulder of a housing, engaging a periphery of the circuit board, inserting the housing within a cavity of a downhole tool and installing a cap over the cavity to prevent removal of the housing from the downhole tool.

18 Claims, 9 Drawing Sheets

(56) References Cited

U.S. PATENT DOCUMENTS

| | | | |
|---|---|---|---|
| 6,437,239 B1* | 8/2002 | Zayatz | H01M 2/0417 |
| | | | 174/527 |
| 6,618,273 B2* | 9/2003 | Zayatz | H01M 2/04 |
| | | | 361/736 |
| 6,785,146 B2* | 8/2004 | Koike | H05K 7/1417 |
| | | | 361/740 |
| 6,865,091 B2* | 3/2005 | Hsu | H05K 7/142 |
| | | | 361/747 |
| 7,040,905 B1* | 5/2006 | Wang | H05K 7/1404 |
| | | | 361/759 |
| 7,215,557 B2* | 5/2007 | Glovatsky | H05K 1/144 |
| | | | 361/748 |
| 7,426,533 B2 | 9/2008 | Malone et al. | |
| 7,505,286 B2* | 3/2009 | Brovald | H05K 7/1417 |
| | | | 174/138 E |
| 7,688,596 B1 | 3/2010 | Gardner et al. | |
| 8,657,242 B2 | 2/2014 | Peng et al. | |
| 9,644,471 B2 | 5/2017 | Logan et al. | |
| 9,648,789 B2 | 5/2017 | Krivonak et al. | |
| 9,736,968 B2 | 8/2017 | Pawlowski et al. | |
| 9,826,655 B1 | 11/2017 | Di Ricco Kurzava et al. | |
| 2009/0067142 A1* | 3/2009 | Tsai | G06F 1/185 |
| | | | 361/759 |
| 2009/0303686 A1* | 12/2009 | Hall | E21B 47/017 |
| | | | 361/752 |
| 2013/0003289 A1* | 1/2013 | Sun | G06F 1/187 |
| | | | 361/679.33 |
| 2013/0328792 A1* | 12/2013 | Myers | G06F 1/1694 |
| | | | 345/173 |
| 2014/0312752 A1* | 10/2014 | Durisotti | E21B 47/017 |
| | | | 312/237 |
| 2016/0265289 A1* | 9/2016 | Goodman | E21B 47/017 |

* cited by examiner

CIRCUIT BOARD MOUNTING IN CONFINED SPACE

The present technology pertains to circuit board mounting and, more specifically, to circuit board mounting in confined spaces for downhole tools.

BACKGROUND

Measurement while drilling (MWD) and logging while drilling (LWD) tools are located in bottom-hole assemblies to provide real-time near-bit information, such as measurements of azimuth, inclination, temperature, pressure, and vibration and strain. These tools have electronic components that must withstand the extremely harsh downhole conditions. Examples of these downhole conditions are temperature, vibration, and intermittent shock among other things. Downhole temperatures routinely reach 150-200° C. and downhole hydrostatic pressures can reach up to 20,000 psi.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which.

DETAILED DESCRIPTION

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Disclosed is a mounting assembly for use in a downhole tool. The assembly includes a sleeve and a circuit board disposed on the proximal end of the sleeve. The proximal end of the sleeve has a plurality of flaps that secures the circuit board on the sleeve. The flaps are defined by corresponding slits extending along a side of the sleeve. The flaps, which may be in an initial (e.g. relaxed) position with the circuit board out of the sleeve, are configured to deflect while receiving the circuit board and to retract (move back toward the initial position) into an engaged position once the circuit board has been received, in order to retain a periphery of the circuit board within the sleeve.

According to at least one example, a mounting assembly for use in a downhole tool is provided. The assembly can include a hollow housing having a shoulder on an interior surface of the housing at a proximal portion of the housing and a groove disposed on the interior surface of the housing spaced apart from the shoulder. The assembly can further include a circuit board disposed on the shoulder of the housing and a ring disposed within the groove of the housing. The ring is configured to retain the circuit board within the housing and against the shoulder.

According to at least one example, a mounting assembly for use in a downhole tool is provided. The assembly can include a hollow housing having a shoulder on an interior surface of the housing at a proximal portion of the housing and a threaded portion on the interior surface extending from a distal end of the housing. The assembly can further include a circuit board disposed on the shoulder of the housing. The assembly can further include a nut threadedly engaged with the threaded portion of the housing. The nut is configured to retain the circuit board within the housing and against the shoulder.

According to at least one aspect, an example method for mounting a circuit board in a downhole tool is provided. The method can include disposing a circuit board on a shoulder of a housing. The method can further include engaging a periphery of the circuit board to prevent removal of the circuit board from the housing. The method can further include inserting the housing within a cavity of a downhole tool and installing a cap over the cavity to prevent removal of the housing from the downhole tool.

Figure 1A:
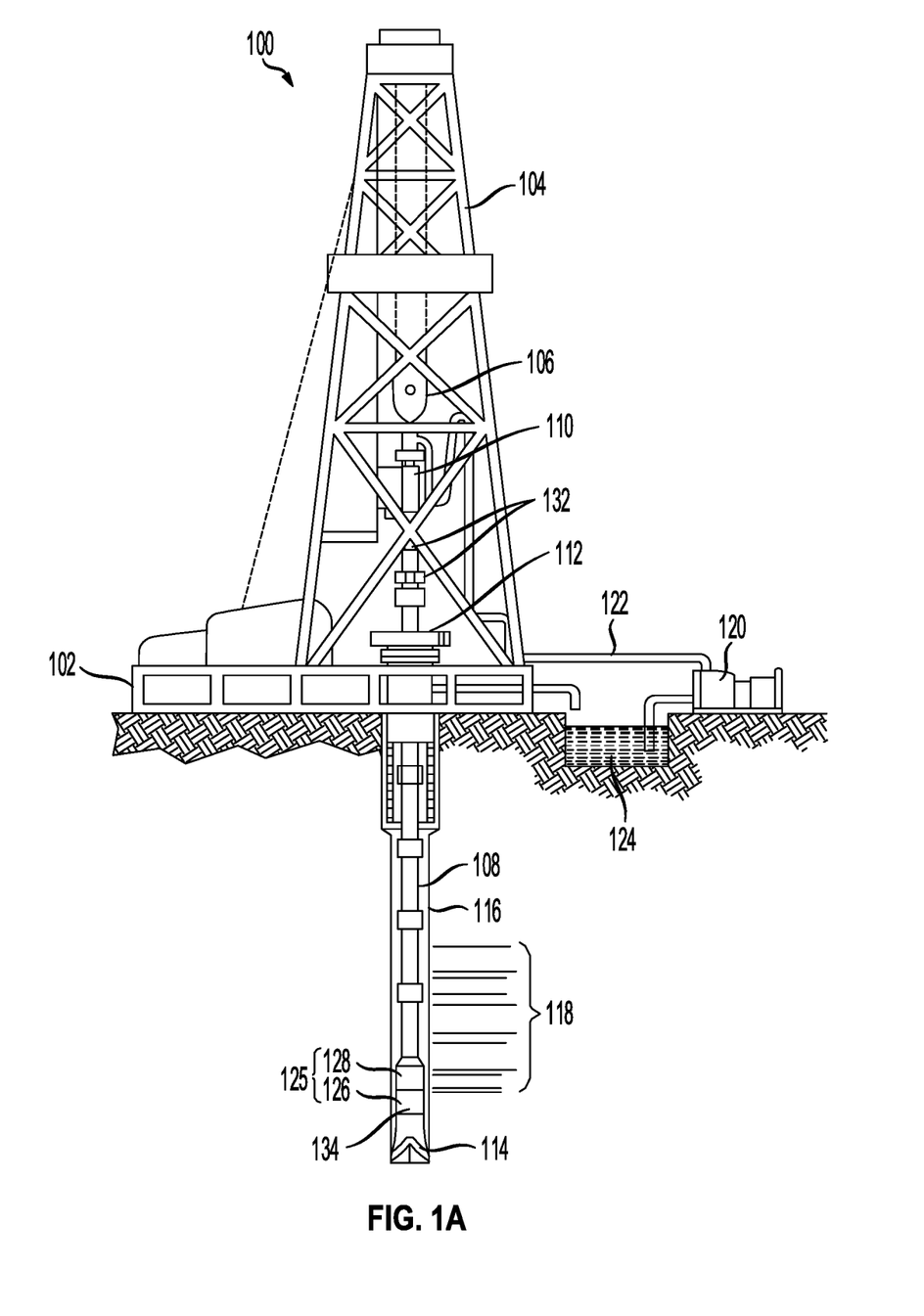
FIG. 1A is a schematic diagram illustrating a logging-while-drilling (LWD) tool environment.

FIG. 1A illustrates a schematic view of a logging while drilling (LWD) wellbore operating environment 100 in accordance with some examples of the present disclosure. As depicted in FIG. 1A, a drilling platform 102 can be equipped with a derrick 104 that supports a hoist 106 for raising and lowering a drill string 108. The hoist 106 suspends a top drive 110 suitable for rotating and lowering the drill string 108 through a well head 112. A drill bit 114 can be connected to the lower end of the drill string 108. As the drill bit 114 rotates, the drill bit 114 creates a wellbore 116 that passes through various formations 118. A pump 120 circulates drilling fluid through a supply pipe 122 to top drive 110, down through the interior of drill string 108 and orifices in drill bit 114, back to the surface via the annulus around drill string 108, and into a retention pit 124. The drilling fluid transports cuttings from the wellbore 116 into the retention pit 124 and aids in maintaining the integrity of the wellbore 116. Various materials can be used for drilling fluid, including oil-based fluids and water-based fluids.

Logging tools 126 can be integrated into the bottom-hole assembly 125 near the drill bit 114. As the drill bit 114 extends the wellbore 116 through the formations 118, logging tools 126 collect measurements relating to various formation properties as well as the orientation of the tool and various other drilling conditions. The bottom-hole assembly 125 may also include a telemetry sub 128 to transfer measurement data to a surface receiver 132 and to receive commands from the surface. In at least some cases, the telemetry sub 128 communicates with a surface receiver 132 using mud pulse telemetry. In some instances, the telemetry sub 128 does not communicate with the surface, but rather stores logging data for later retrieval at the surface when the logging assembly is recovered.

Each of the logging tools 126 may include one or more tool components spaced apart from each other and communicatively coupled with one or more wires and/or other media. The logging tools 126 may also include one or more computing devices 134 communicatively coupled with one or more of the one or more tool components by one or more wires and/or other media. The one or more computing devices 134 may be configured to control or monitor a performance of the tool, process logging data, and/or carry out one or more aspects of the methods and processes of the present disclosure.

In at least some instances, one or more of the logging tools 126 may communicate with a surface receiver 132 by a wire, such as wired drillpipe. In other cases, the one or more of the logging tools 126 may communicate with a surface receiver 132 by wireless signal transmission. In at least some cases, one or more of the logging tools 126 may receive electrical power from a wire that extends to the surface, including wires extending through a wired drillpipe.

Figure 1B:
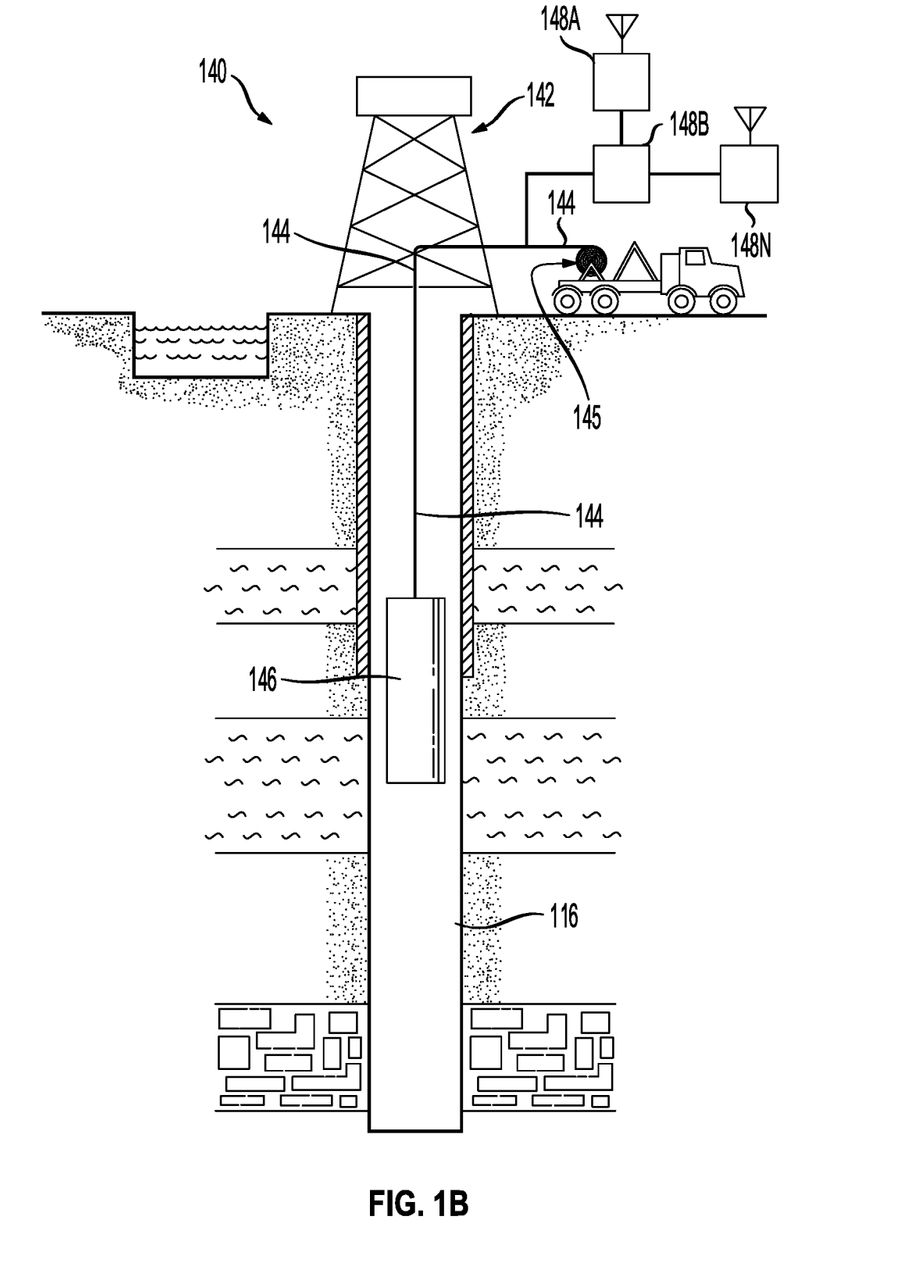
FIG. 1B is a schematic diagram illustrating an example system for downhole line detection in a downhole environment having tubulars.

Referring to FIG. 1B, an example system 140 for downhole line detection in a downhole environment having tubulars can employ a tool having a tool body 146 in order to carry out logging and/or other operations. For example, instead of using the drill string 108 of FIG. 1A to lower tool body 146, which may contain sensors or other instrumentation for detecting and logging nearby characteristics and conditions of the wellbore 116 and surrounding formation, a wireline conveyance 144 can be used. The tool body 146 can include a resistivity logging tool. The tool body 146 can be lowered into the wellbore 116 by wireline conveyance 144. The wireline conveyance 144 can be anchored in the drill rig 145 or a portable means such as a truck. The wireline conveyance 144 can include one or more wires, slicklines, cables, and/or the like, as well as tubular conveyances such as coiled tubing, joint tubing, or other tubulars.

The illustrated wireline conveyance 144 provides support for the tool, as well as enabling communication between tool processors 148A-N on the surface and providing a power supply. In some examples, the wireline conveyance 144 can include electrical and/or fiber optic cabling for carrying out communications. The wireline conveyance 144 is sufficiently strong and flexible to tether the tool body 146 through the wellbore 116, while also permitting communication through the wireline conveyance 144 to one or more processors 148A-N, which can include local and/or remote processors. Moreover, power can be supplied via the wireline conveyance 144 to meet power requirements of the tool. For slickline or coiled tubing configurations, power can be supplied downhole with a battery or via a downhole generator.

Figure 2A:
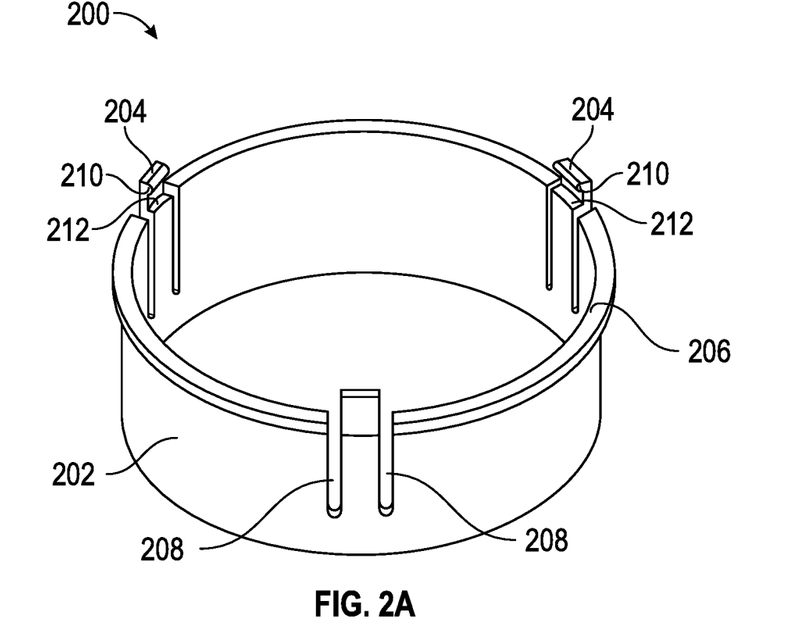
FIG. 2A is an illustration of a sleeve configured to be used in an embodiment of the circuit board mounting assembly, in accordance with the present disclosure.
Figure 2B:
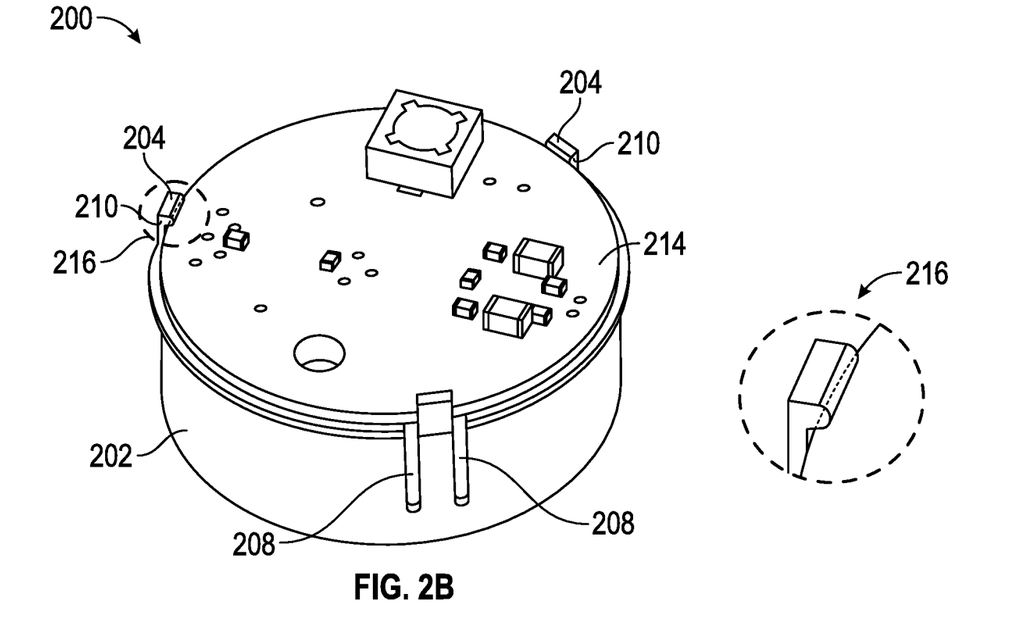
FIG. 2B is an illustration of an embodiment of the circuit board mounting assembly, in accordance with the present disclosure.

FIG. 2A is an illustration of a sleeve 200 configured to be used in an embodiment of the circuit board mounting assembly, in accordance with the present disclosure. The sleeve 200 includes a plurality of flaps 204. Although there are three flaps 204 shown in the figure there can be more or less flaps 204 utilized in the present disclosure. The flaps 204 each have a slit 208 extending along the side 202 of the sleeve in order to allow the flaps 204 to deflect to allow a circuit board to be mounted thereon, which is shown in FIG. 2B. The flaps are in an initial position when the circuit board is outside of the sleeve. The initial position may be referred to as a relaxed position in that there may be no appreciable loading of the flaps in the initial position.

FIG. 2B is an illustration of an embodiment of the circuit board mounting assembly, in accordance with the present disclosure. The circuit board 214 is disposed on the proximal end 206 of the sleeve 200. The flaps 204 on the sleeve 200 can be deflected to receive the circuit board 214. The periphery of the circuit board is retained within the flaps 204 on the sleeve 200. The protrusions 210 prevent the circuit board 214 from being removed from the sleeve 200 by virtue of the protrusions 210 holding the periphery of the circuit board 214 down. The flaps 204 have a flattened surface 212 that is aligned with the proximal end of the sleeve 200. The flattened surface 212 supports the periphery of the circuit board 214 and allows the circuit board 214 to be self-locked in place to sustain shock and vibration from downhole conditions.

As shown further in FIG. 2B, the flaps 204 deflect (the deflection is outwardly in the illustrated configuration) as the circuit board is received, in response to movement of a portion of the circuit board past a retention feature defined by the flaps 204. While the flaps 204 deflect, the circuit board can be moved further and positioned inside the flaps 204. The flaps 204 retract back at least partially toward the initial position in response to the portion of the circuit board 216 moving past the retention feature, until the circuit board is fully received within the sleeve and retained by the flaps. The sleeve 200 can be circular, rectangular, or any other shape that is consistent with the circuit board mounted thereon. The sleeve 200 can be made of plastic so that it has some flexibility. In other examples, the sleeve 200 can be made of metal. The flaps 204 include protrusions 210 which extend towards the center of the sleeve.

Figure 3A:
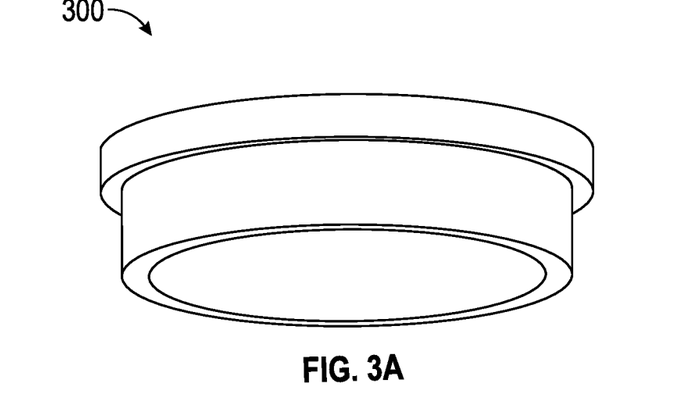
FIG. 3A is an illustration of a nut configured to be used in an embodiment of the circuit board mounting assembly, in accordance with the present disclosure.

FIG. 3A is an illustration of a nut 300 configured to be used in an embodiment of the circuit board mounting assembly, in accordance with the present disclosure. The threaded nut 300 can be made of plastic or metal. The nut 300 is configured to be threadedly engaged with the housing 310, further described in FIG. 3B. The nut 300 is long enough to contact a bottom surface of a cavity of the collar of a downhole tool, or any other part of the downhole tool that the cavity may be placed. The nut 300 can be of any size corresponding to the respective housing 310 and circuit board 214 mounted thereon. The nut 300 is threaded in the housing 310 after the circuit board 214 is disposed within the housing 310 in order to keep the circuit board 214 within the housing 310, as shown in FIG. 3C.

Figure 3B:
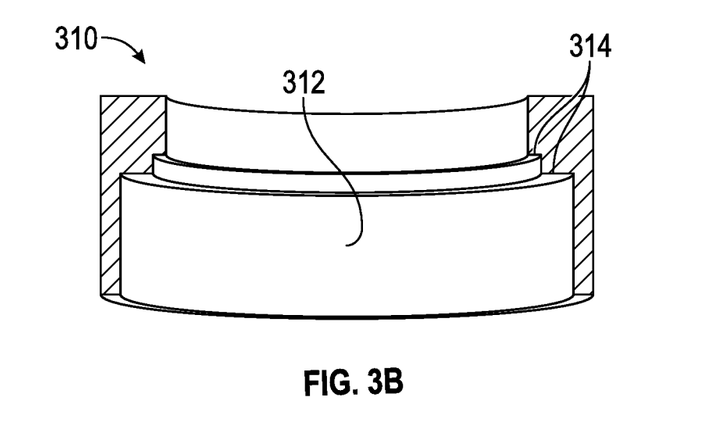
FIG. 3B is a cross sectional view of a housing configured to be used in an embodiment of the circuit board mounting assembly, in accordance with the present disclosure.

FIG. 3B is a cross sectional view of a housing 310 configured to be used in an embodiment of the circuit board mounting assembly, in accordance with the present disclosure. The housing 310 has an interior surface with a threaded portion 312. The threaded portion 312 may vary in shape and may have more or less threads than depicted in FIG. 3B. The housing 310 can be made of plastic, metal, or any other kind of material. The housing 310, as depicted, has two shoulders 314, one receivable to the circuit board 214 and the other receivable to the threaded nut 300, described above. However, in some examples, the housing 310 can have more than two shoulders 314. The shoulders 314 are configured to hold the circuit board 214 within the housing 310 after a nut 300 is placed within the housing 310.

Figure 3C:
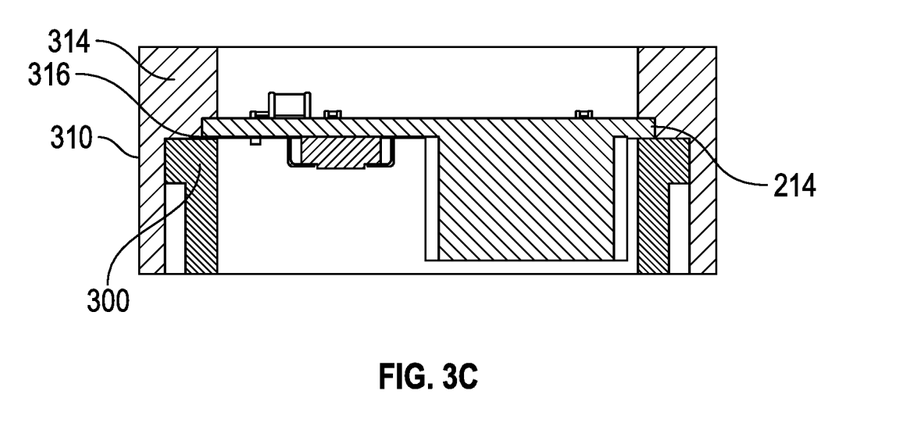
FIG. 3C is a cross sectional view of an embodiment of the circuit board mounting assembly, in accordance with the present disclosure.

FIG. 3C is a cross sectional view of an embodiment of the circuit board mounting assembly, in accordance with the present disclosure. The circuit board mounting assembly includes a circuit board 214 attached to the interior surface of the housing 310. The shoulder 314 of the housing 310 supports the top surface of the circuit board 214. The threaded portion 312 of the housing 310 is engaged with the nut 300 and used to support the circuit board 214. An insulator 316 such as any non-conductive material or foam can be disposed between the circuit board 214 and the nut 300 to protect the electronics on the circuit board 214 from the vibrations. In one aspect, the assembly of the housing 310, circuit board 214 and the nut 300 may be disposed as an assembly within a cavity of a collar of a downhole tool.

Figure 4A:
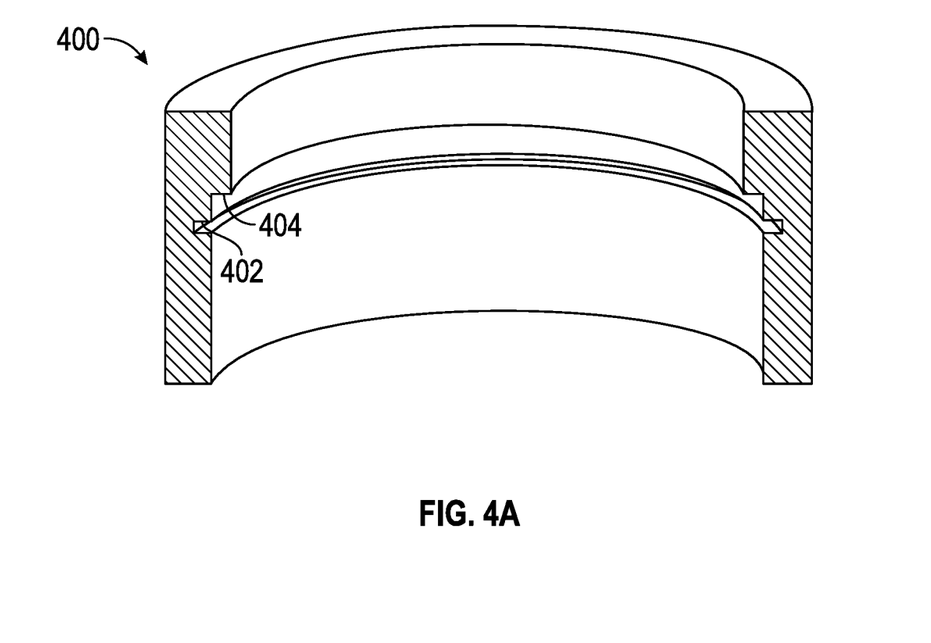
FIG. 4A is a cross sectional view of a housing configured to be used in an embodiment of the circuit board mounting assembly, in accordance with the present disclosure.

FIG. 4A is a cross sectional view of a housing 400 configured to be used in an embodiment of the circuit board mounting assembly, in accordance with the present disclosure. The housing 400 can be made of plastic, metal, or any other material. The housing 400 can include a shoulder 402 and a groove 404 to hold components of the assembly in place and lock it under vibration. The shoulder 402 is configured to support a circuit board 214 and the groove 404 is configured to receive a ring 406, as shown in FIG. 4B.

Figure 4B:
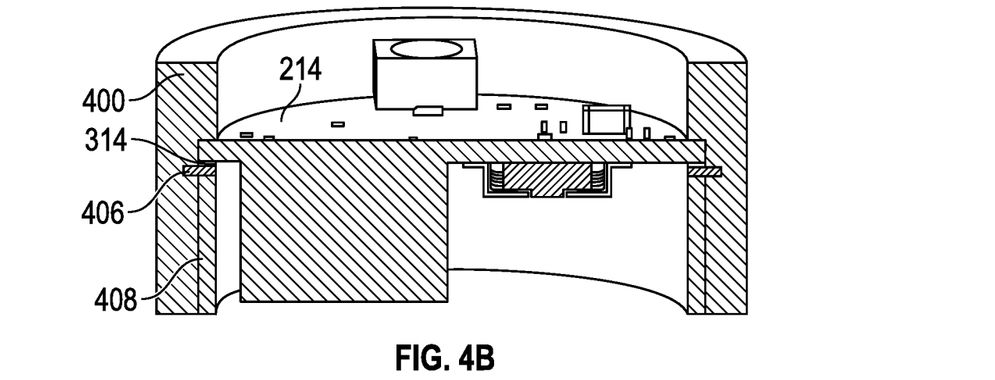
FIG. 4B is a cross sectional view of an embodiment of the circuit board mounting assembly, in accordance with the present disclosure.

FIG. 4B is a cross sectional view of an embodiment of the circuit board mounting assembly, in accordance with the present disclosure. The circuit board 214 can be disposed on the shoulder 402 and a ring 406 can be disposed in the groove 404. The ring 406 can be a retaining ring or a snap ring. In some examples, a spacer ring 408 can be disposed under the retainer ring 406 to provide additional support for the ring 406 and the circuit board 214. The spacer ring 408 can keep the ring 406 in place, so that the ring 406 is not lost when the assembly undergoes vibration. An insulator 316 such as any non-conductive material or foam can be disposed between the circuit board 214 and the ring 406 to protect the electronics on the circuit board 214 from the vibrations. In one aspect, the assembly of the housing 400, circuit board 214, ring 406 and spacer 408 may be disposed as an assembly within a cavity of a collar of a downhole tool.

Figure 5:
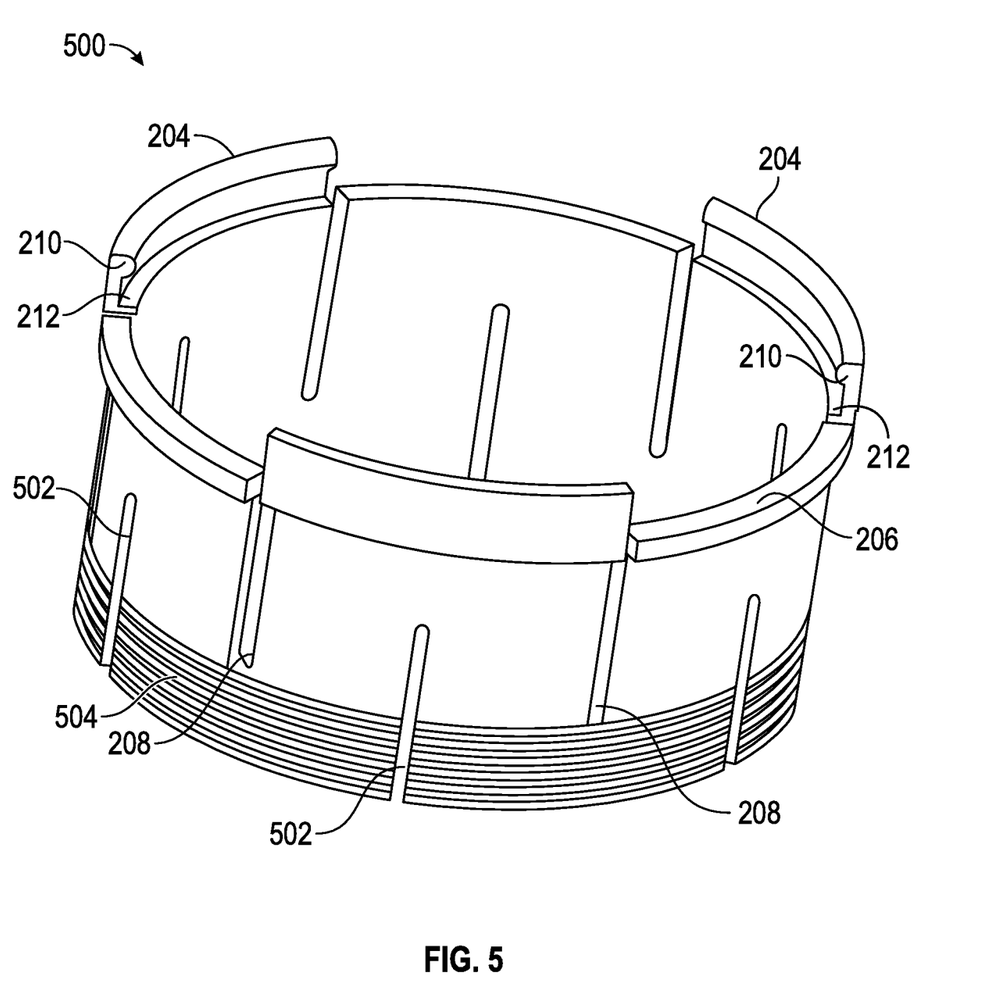
FIG. 5 is a schematic diagram illustrating an embodiment of the circuit board mounting assembly, in accordance with the present disclosure.

FIG. 5 is a schematic diagram illustrating an embodiment of the circuit board mounting assembly, in accordance with the present disclosure. In some examples, the sleeve 200 from FIG. 2A-2B can have additional slits 502. The number of additional slits 502 can vary depending on various circumstances under which the sleeve 200 is to be compressed and pushed inside a cavity or the collar of a downhole tool any other part of the downhole tool. The additional slits 502 can aid in the flexibility of the sleeve 200. In some examples, the sleeve 200 can have an uneven surface 504 of a repeated profile. The repeated profile of the uneven surface 504 can be a sawtooth, sinusoidal, zigzag, or any other repeatable pattern. The uneven surface 504 engages with an inner surface of a cavity, as shown in FIG. 6B, and locks it under vibration. The embodiment may have only an uneven surface 504, only additional slits 502, both an uneven surface 504 and additional slits 502, or neither. In one aspect, the cavity may also have an uneven surface to enable the uneven surface 504 of the sleeve to engage an uneven surface of the cavity to further lock the sleeve and associated components within the cavity.

Figure 6A:
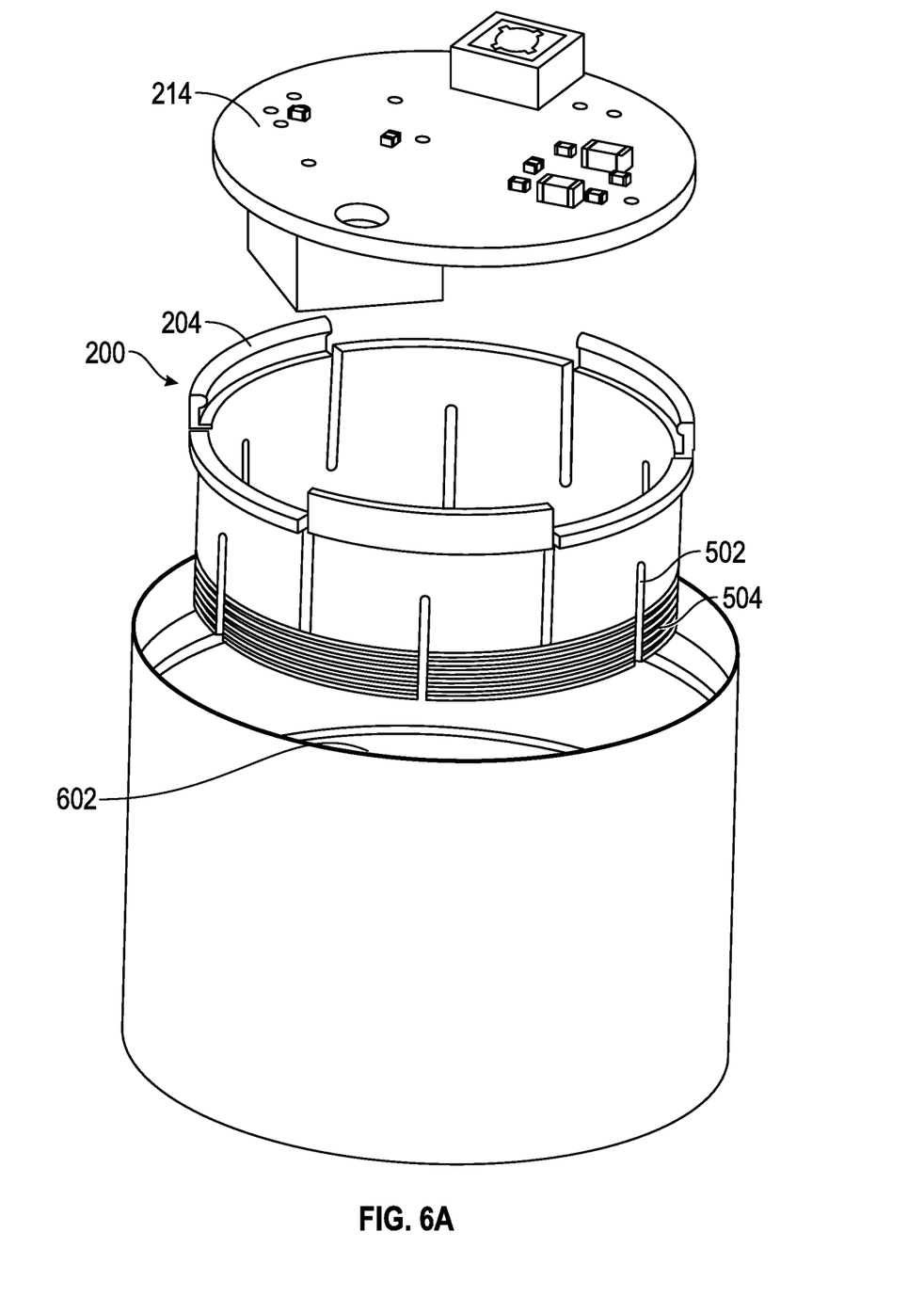
FIG. 6A is an exploded view of the assembly mounted in a cavity of a downhole tool, in accordance with some examples.
Figure 6B:
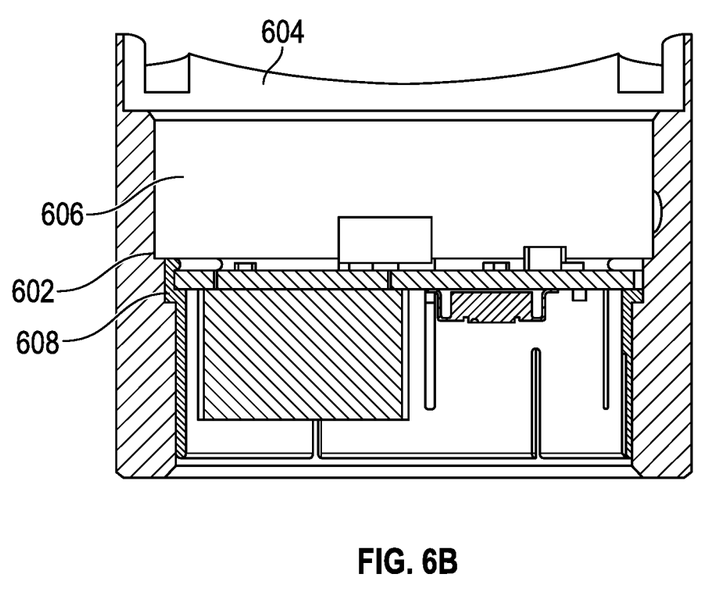
FIG. 6B is a schematic diagram of the assembly mounted in a cavity of a downhole tool, in accordance with some examples.

FIG. 6A is an exploded view of the assembly mounted in a cavity 602 of a downhole tool, in accordance with some examples. In the embodiment of the sleeve 200 with a plurality of flaps 204, the sleeve 200 can be installed in a cavity 602 of a downhole tool. The circuit board 214 is disposed atop of the sleeve 200. Although the embodiment of the sleeve 200 is shown with the additional slits 502 and uneven surface 504, these features are not necessarily present in this example. The assembly can be placed in a drill collar, electronic insert, or anywhere else within a downhole tool.

FIG. 6B is a schematic diagram of the assembly mounted in a cavity 602 of a downhole tool, in accordance with some examples. The sleeve 200 is receivable within a cavity 602. The circuit board 214 and sleeve 200 can be disposed into the cavity 602 of the downhole tool. When the sleeve 200 is installed within the cavity 602, the inner sidewall 608 of the cavity 602 prevents the flaps from deflecting outward thereby locking the circuit board within the sleeve 200.

A cap or bolt 604 can be disposed atop of the cavity 602 with the assembly enclosed therein to further prevent removal of the circuit board 214 from the cavity 602. The cap or bolt 604 sandwiches the entire assembly in the cavity 602 so that the mounted circuit board 214 doesn't move upwards out of the cavity 602. The sleeve 200 can be glued to metal body 606 using an epoxy to prevent it from rotating axially or radially. The sleeve 200 can have O-ring grooves on the outside as well or as an alternative means to prevent it from rotating axially or radially.

Figure 7:
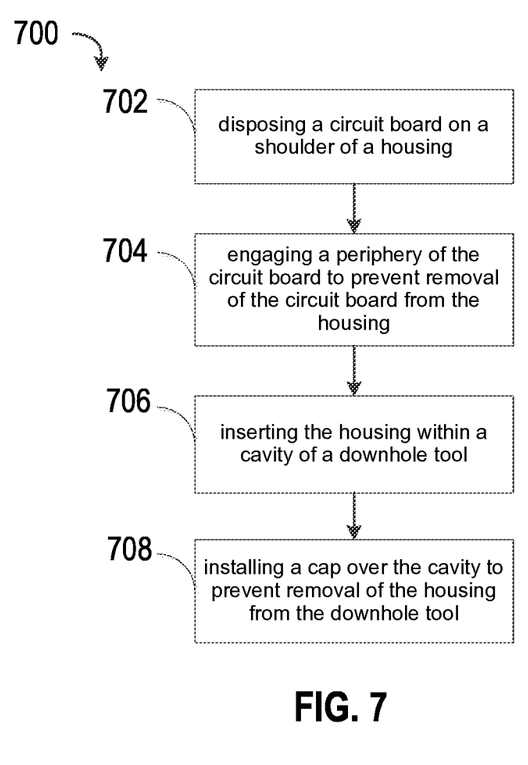
FIG. 7 is a flow chart of a method for mounting a circuit board in a downhole tool.

FIG. 7 is a flow chart of a method for mounting a circuit board in a downhole tool. The method 700 is provided by way of example, as there are a variety of ways to carry out the method. The method 700 described below can be carried out using the configurations illustrated in FIGS. 2A-6B, for example, and various elements of these figures are referenced in explaining example method 700. Each block shown in FIG. 7 represents one or more processes, methods or subroutines, carried out in the example method 700. Furthermore, the illustrated order of blocks is illustrative only and the order of the blocks can change according to the present disclosure. Additional blocks may be added or fewer blocks may be utilized, without departing from this disclosure. The example method 700 can begin at block 702.

At block 702, a circuit board is disposed on a shoulder of a housing 310. A circuit board 214 is mounted from the bottom side of the housing 310 and a threaded nut 300 is placed in the housing subsequent to the mounting of the circuit board. The board sits on the shoulder 314 and the end piece is a threaded nut 300. The threaded nut 300 sits on another shoulder 314. The housing 310 has at least two shoulders 314 and tightens the threaded nut 300 which locks the circuit board 214 and sandwiches it in between the nut 300 and one of the shoulders 314. In some examples, a housing 400 can have a shoulder 402 and a groove 404, where the groove 404 can receive a ring 406. The ring 406 sandwiches the circuit board 214 with the shoulder 402 of the housing 400.

At block 704, a periphery of the circuit board 214 is engaged with the housing 310, 400 to prevent removal of the circuit board 214 from the housing 310, 400. The periphery of the board 214 can be engaged with grooves 404 within the housing and supported by a shoulder 314, 402 of the housing 310, 400. In some examples, the periphery of the board 214 can be engaged with a plurality of flaps 204 on a sleeve 200.

At block 706, the housing 310, 400 is inserted within a cavity 602 of a downhole tool. The downhole tool can be a logging tool 126, as described above. The housing 310, 400 is secured by sidewalls 608 that prevent the housing 310, 400 from moving radially or axially once placed in the cavity 602. In some examples, the housing 310, 400 can be inserted in a tool collar or an electronic insert.

At block 708, a cap or bolt 604 is installed over the cavity to prevent removal of the housing from the downhole tool. The cap or a bolt 604 can be placed over the cavity 602 holding the housing 310, 400 therein in order to prevent lateral movement of the assembly and keep it from coming out of the cavity 602.

Various aspects of the subject technology provide several technological improvements over other approaches and solve various technical issues seen in other approaches. For example, as noted above, the sleeve 200 is compressible to be installed into a cavity or collar and has a rough surface to lock it under vibration in confined spaces. In contrast, other approaches may involve mounting a circuit board using a post mount or a rail mount that utilizes a chassis, which is not practical for a confined limited space such as the junction bar in Electromagnetic Wave Resistivity (EWR) and Azimuthal Deep Resistivity (ADR) tools. Additionally, less material is to be removed from the tool collar to house the circuit board using the subject technology, which in turn increases the mechanical rating and reliability of the tool.

In the foregoing description, aspects of the application are described with reference to specific embodiments thereof, but those skilled in the art will recognize that the application is not limited thereto. Thus, while illustrative embodiments of the application have been described in detail herein, it is to be understood that the disclosed concepts may be otherwise variously embodied and employed, and that the appended claims are intended to be construed to include such variations, except as limited by the prior art. Various features and aspects of the above-described subject matter may be used individually or jointly. Further, embodiments can be utilized in any number of environments and applications beyond those described herein without departing from the broader spirit and scope of the specification. The specification and drawings are, accordingly, to be regarded as illustrative rather than restrictive. For the purposes of illustration, methods were described in a particular order. It should be appreciated that in alternate embodiments, the methods may be performed in a different order than that described.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

In the above description, terms such as "upper," "upward," "lower," "downward," "above," "below," "downhole," "uphole," "longitudinal," "lateral," and the like, as used herein, shall mean in relation to the bottom or furthest extent of the surrounding wellbore even though the wellbore or portions of it may be deviated or horizontal. Correspondingly, the transverse, axial, lateral, longitudinal, radial, etc., orientations shall mean orientations relative to the orientation of the wellbore or tool. Additionally, the illustrate embodiments are illustrated such that the orientation is such that the right-hand side is downhole compared to the left-hand side.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicate that at least a portion of a region is partially contained within a boundary formed by the object. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder.

Although a variety of information was used to explain aspects within the scope of the appended claims, no limitation of the claims should be implied based on particular features or arrangements, as one of ordinary skill would be able to derive a wide variety of implementations. Further and although some subject matter may have been described in language specific to structural features and/or method steps, it is to be understood that the subject matter defined in the appended claims is not necessarily limited to these described features or acts. Such functionality can be distributed differently or performed in components other than those identified herein. The described features and steps are disclosed as possible components of systems and methods within the scope of the appended claims.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

Statements of the Disclosure Include:

Statement 1: A circuit board mounting assembly for use in a downhole tool, the mounting assembly comprising a sleeve comprising a plurality of flaps extending from a proximal end of the sleeve, the plurality of flaps defined by corresponding slits extending along a side of the sleeve; and a circuit board disposed on the proximal end of the sleeve and secured by the plurality of flaps, wherein the plurality of flaps are configured to deflect in response to movement of a portion of the circuit board past a retention feature defined by the flaps and return in response to the portion of the circuit board moving past the retention feature, and wherein a periphery of the circuit board is retained within the sleeve by the plurality of flaps.

Statement 2: An assembly according to Statement 1, wherein each flap of the plurality of flaps further comprise a flattened surface aligned with the proximal end of the sleeve, wherein the flattened surface is configured to support the periphery of the circuit board.

Statement 3: An assembly according to any of Statements 1 and 2, wherein each flap of the plurality of flaps further comprise a protrusion extending inward toward a center of the sleeve, wherein the protrusion is configured to prevent removal of the circuit board with respect to the sleeve.

Statement 4: An assembly according to any of Statements 1 through 3, wherein the plurality of flaps are arranged equidistantly apart from each other.

Statement 5: An assembly according to any of Statements 1 through 4, wherein the sleeve further comprises a plurality of slits extending from a distal end of the sleeve, wherein the plurality of slits are configured to flex inward toward a center of the sleeve to reduce a dimension of the sleeve.

Statement 6: An assembly according to any of Statements 1 through 5, wherein the sleeve further comprises an uneven surface on a distal portion of the sleeve.

Statement 7: An assembly according to any of Statements 1 through 6, wherein the uneven surface comprises at least one of a sawtooth, sinusoidal, and zigzag profile.

Statement 8: An assembly according to any of Statements 1 through 7, further comprising a downhole tool, wherein the downhole tool comprises a cavity configured to receive the sleeve and circuit board, wherein a sidewall of the cavity is configured to prevent deflection of the plurality of flaps when the sleeve is disposed within the cavity; and a cap disposed over the sleeve and circuit board when the sleeve is disposed within the cavity.

Statement 9: A circuit board mounting assembly for use in a downhole tool, the mounting assembly comprising a hollow housing comprising a shoulder on an interior surface of the housing at a proximal portion of the housing, and a groove disposed on the interior surface and spaced apart from the shoulder; a circuit board disposed on the shoulder of the housing; and a ring disposed within the groove, the ring configured to retain the circuit board within the housing and against the shoulder.

Statement 10: An assembly according to Statement 9, further comprising an insulator disposed between the ring and the circuit board.

Statement 11: An assembly according to any of Statements 9 and 10, further comprising a spacer disposed between the ring and a distal end of the housing, the spacer configured to prevent removal of the circuit board from the housing.

Statement 12: An assembly according to any of Statements 9 and 11, further comprising: a downhole tool, wherein the downhole tool comprises a cavity configured to receive the housing; and a cap disposed over the housing when the housing is disposed within the cavity.

Statement 13: A circuit board mounting assembly for use in a downhole tool, the mounting assembly comprising a hollow housing comprising a shoulder on an interior surface of the housing at a proximal portion of the housing, and a threaded portion on the interior surface extending from a distal end of the housing; a circuit board disposed on the shoulder of the housing; and a nut threadedly engaged with the threaded portion of the housing, the nut configured to retain the circuit board within the housing and against the shoulder.

Statement 14: A system according to Statement 13, further comprising an insulator disposed between the nut and the circuit board.

Statement 15: A system according to any of Statements 13 through 14, further comprising a downhole tool, wherein the downhole tool comprises a cavity configured to receive the housing; and a cap disposed over the housing when the housing is disposed within the cavity.

Statement 16: A system according to any of Statements 13 through 15, wherein the nut further comprises a support portion extending from the distal end of the nut, the support portion configured to prevent removal of the nut from the housing when the housing is disposed within the cavity.

Statement 17: A method for mounting a circuit board in a downhole tool comprising disposing a circuit board on a shoulder of a housing; engaging a periphery of the circuit board to prevent removal of the circuit board from the housing; inserting the housing within a cavity of a downhole tool; and installing a cap over the cavity to prevent removal of the housing from the downhole tool.

Statement 18: A system according to Statement 17, wherein the engaging the periphery of the circuit board comprises engaging the periphery of the circuit board using a plurality of flaps extending from the housing.

Statement 19: A system according to any of Statements 17 through 18, wherein the engaging the periphery of the circuit board comprises engaging the periphery of the circuit board using a ring disposed within a groove of the housing.

Statement 20: A system according to any of Statements 17 through 19, wherein the engaging the periphery of the circuit board comprises engaging the periphery of the circuit board using a nut threaded within the housing.

Statement 21: A system comprising means for performing a method according to any of Statements 17 through 20.

What is claimed is:

1. A circuit board mounting assembly for use in a downhole tool, the mounting assembly comprising:
   a sleeve comprising a plurality of flaps extending from a proximal end of the sleeve, the plurality of flaps defined by a corresponding plurality of slits extending along a side of the sleeve; and
   a circuit board disposed on the proximal end of the sleeve and secured by the plurality of flaps,
   wherein the plurality of flaps are configured to deflect in response to engagement of a portion of the circuit board with a retention feature defined by the flaps and retract in response to the portion of the circuit board moving past the retention feature,
   wherein each of the plurality of flaps includes an outer surface configured to engage an inner sidewall of a cavity of the downhole tool when the sleeve is installed within the cavity of the downhole tool to prevent outward deflection of each of the plurality of flaps, and wherein a periphery of the circuit board is retained within the sleeve by the plurality of flaps; and a cap disposed over the sleeve and circuit board when the sleeve is disposed within the cavity.

2. The circuit board mounting assembly of claim 1, wherein each flap of the plurality of flaps further comprise a flattened surface aligned with the proximal end of the sleeve, wherein the flattened surface is configured to support the periphery of the circuit board.

3. The circuit board mounting assembly of claim 1, wherein each flap of the plurality of flaps further comprise a protrusion extending inward toward a center of the sleeve, wherein the protrusion is configured to prevent removal of the circuit board with respect to the sleeve.

4. The circuit board mounting assembly of claim 1, wherein the plurality of flaps are arranged equidistantly apart from each other.

5. The circuit board mounting assembly of claim 1, wherein the plurality of slits extend from a distal end of the sleeve, wherein the plurality of slits are configured to flex inward toward a center of the sleeve to reduce a dimension of the sleeve.

6. The circuit board mounting assembly of claim 1, wherein the sleeve further comprises an uneven surface on a distal portion of the sleeve.

7. The circuit board mounting assembly of claim 6, wherein the uneven surface comprises at least one of a sawtooth, sinusoidal, and zigzag profile.

8. The circuit board mounting assembly of claim 1, wherein the downhole tool is a logging tool configured to collect measurements related to properties of a wellbore in which the downhole tool is disposed.

9. The circuit board mounting assembly of claim 1, wherein the downhole tool is a logging tool configured to collect measurements related to either or both an orientation of the downhole tool and drilling conditions when the downhole tool is disposed in a wellbore.

10. A method for mounting a circuit board in a downhole tool comprising:

providing a sleeve comprising a plurality of flaps extending from a proximal end of the sleeve, the plurality of flaps defined by a corresponding plurality of slits extending along a side of the sleeve;

disposing a circuit board within the sleeve towards the proximal end of the sleeve; and engaging the circuit board with the plurality of flaps towards the proximal end of the sleeve to secure the circuit board within the sleeve, wherein the plurality of flaps are configured to deflect in response to engagement of a portion of the circuit board with a retention feature defined by the flaps and retract in response to the portion of the circuit board moving past the retention feature, wherein each of the plurality of flaps includes an outer surface configured to engage an inner sidewall of a cavity of the downhole tool when the sleeve is installed within the cavity of the downhole tool to prevent outward deflection of each of the plurality of flaps, and wherein a periphery of the circuit board is retained within the sleeve by the plurality of flaps; and disposing a cap over the sleeve and circuit board when the sleeve is disposed within the cavity.

11. The method of claim 10, wherein each flap of the plurality of flaps further comprise a flattened surface aligned with the proximal end of the sleeve, wherein the flattened surface is configured to support the periphery of the circuit board.

12. The method of claim 10, wherein each flap of the plurality of flaps further comprise a protrusion extending inward toward a center of the sleeve, wherein the protrusion is configured to prevent removal of the circuit board with respect to the sleeve.

13. The method of claim 10, wherein the plurality of flaps are arranged equidistantly apart from each other.

14. The method of claim 10, wherein the plurality of slits extend from a distal end of the sleeve, wherein the plurality of slits are configured to flex inward toward a center of the sleeve to reduce a dimension of the sleeve.

15. The method of claim 10, wherein the sleeve further comprises an uneven surface on a distal portion of the sleeve.

16. The method of claim 15, wherein the uneven surface comprises at least one of a sawtooth, sinusoidal, and zigzag profile.

17. The method of claim 10, further comprising inserting the sleeve with the contained circuit board into the cavity of the downhole tool.

18. The method of claim 17, wherein the downhole tool is a logging tool configured to collect measurements related to one or a combination of formation properties of a wellbore in which the downhole tool is disposed, an orientation of the downhole tool when the downhole tool is disposed in the wellbore, and drilling conditions when the downhole tool is disposed in the wellbore.

* * * * *